(12) United States Patent
Yakabe

(10) Patent No.: US 6,633,247 B2
(45) Date of Patent: Oct. 14, 2003

(54) LOGARITHMIC A/D CONVERTER, METHOD OF LOGARITHMIC A/D CONVERSION LOGARITHMIC D/A CONVERTER, METHOD OF LOGARITHMIC D/A CONVERSION, AND SYSTEM FOR MEASURING PHYSICAL QUANTITY

(75) Inventor: Masami Yakabe, Hyogo (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 72 days.

(21) Appl. No.: 09/958,567

(22) PCT Filed: Feb. 13, 2001

(86) PCT No.: PCT/JP01/00998

§ 371 (c)(1),
(2), (4) Date: Nov. 27, 2001

(87) PCT Pub. No.: WO01/59933

PCT Pub. Date: Aug. 16, 2001

(65) Prior Publication Data

US 2002/0181257 A1 Dec. 5, 2002

(30) Foreign Application Priority Data

Feb. 14, 2000 (JP) ........................................ 2000-034874

(51) Int. Cl.[7] .......................... H03M 1/62; H03M 1/84; H03M 1/88; G06F 7/556; G06G 7/24
(52) U.S. Cl. ........................................ 341/138; 327/350
(58) Field of Search ................................. 341/155, 120, 341/138, 150, 172, 110; 250/214 A, 207; 375/249; 379/406.06, 406.11; 708/322; 327/350

(56) References Cited

U.S. PATENT DOCUMENTS

| | | | | |
|---|---|---|---|---|
| 3,646,548 A | * | 2/1972 | Van Doren | 341/138 |
| 4,142,185 A | * | 2/1979 | Gordon | 341/138 |
| 5,699,004 A | * | 12/1997 | Picciotto | 327/350 |
| 6,002,122 A | * | 12/1999 | Wolf | 250/207 |

FOREIGN PATENT DOCUMENTS

| | | |
|---|---|---|
| JP | S52-134358 | 11/1977 |
| JP | S54-57855 | 5/1979 |
| JP | S58-57132 | 4/1983 |
| JP | 58-057132 | 4/1983 |
| JP | 59-231456 | 12/1984 |
| JP | S61-70439 | 5/1986 |
| JP | 61-70439 | 5/1986 |
| JP | 01-158878 | 6/1989 |
| JP | 02-050523 | 2/1990 |

\* cited by examiner

*Primary Examiner*—Patrick Wamsley
(74) *Attorney, Agent, or Firm*—Barnes & Thornburg

(57) ABSTRACT

An analog multiplier 11 raises a base reference voltage "Vref0" to the nth power so that a reference voltage "Vref1" is produced. Analog multipliers 12 and 13 sequentially raise the reference voltage "Vref1" to the nth power so that reference voltages "Vref2" and "Vref3" are produced. Switch groups 38–41 control the reference voltages "Vref0" to "Vref3", which are then sent to an analog multiplier 14 together with an input voltage "Vin". A comparator 14 sequentially compares a multiplication result "Vx" of the multiplier 14 with a voltage "Vout" outputted from a sensor circuit 2, so that a digital output value "Dout" is produced. The analog multiplier 14 is set as appropriate.

15 Claims, 8 Drawing Sheets

LOGARITHMIC A/D CONVERTER, METHOD OF LOGARITHMIC A/D CONVERSION LOGARITHMIC D/A CONVERTER, METHOD OF LOGARITHMIC D/A CONVERSION, AND SYSTEM FOR MEASURING PHYSICAL QUANTITY

TECHNICAL FIELD

The present invention relates to a logarithmic A/D converter, a logarithmic A/D conversion method, a logarithmic D/A converter, a logarithmic D/A conversion method, and a physical quantity measuring system.

BACKGROUND ART

A logarithmic A/D converter has been used to perform A/D conversion on a detection signal that has a wide dynamic range. This is because a logarithmic A/D converter is capable of providing more sufficient resolution for infinitesimal input than a linear A/D converter, and performing A/D conversion on a higher inputted voltage without becoming saturated. Japanese Laid-Open Patent Application H01-158878 discloses an example of such conventional logarithmic A/D converter. FIG. 6 is a circuit diagram showing this conventional logarithmic A/D converter. As shown in the figure, a reference voltage "Vref" is applied to a reference voltage terminal 44 of the logarithmic A/D converter, and divided by a plurality of resistors 47 having different resistance so that divided voltages form a progression corresponding to a logarithmic function. Voltage divided by each of the resistors 47 is compared by comparators 42 with an input voltage "Vin" inputted via an analog input terminal 45. In accordance with a result of this comparison, each of the comparators 42 outputs a logic signal set at either high or low. A decoder 43 converts these logic signals into a digital signal "Dout" represented in binary code, and the converted digital signal "Dout" is outputted from a digital output terminal 46. In this way, the above conventional A/D converter divides the reference voltage "Vref" by using resistors 47 to produce divided voltages that form the logarithmic function progression, and outputs the digital signal "Dout".

DISCLOSURE OF INVENTION

A logarithmic A/D converter of the present invention comprises a reference voltage generating unit, a comparison voltage operating unit, and a comparator as described below. The reference voltage generating unit includes at least one first multiplier that raises a predetermine voltage to the nth power to generate a plurality of reference voltages, of which a reference voltage is the nth power of another reference voltage. Based on at least one of the reference voltages, the comparison voltage operating unit generates a comparison voltage. Based on the generated comparison voltage, the comparator generates a digital output value corresponding to a voltage to be converted.

A logarithmic A/D conversion method of the present invention includes the following: generating a plurality of reference voltages, wherein values of the reference voltages have a relation of a progression made by raising the reference voltages to an nth power; generating a plurality of comparison voltages based on at least one of the plurality of reference voltages; and determining an output digital value based on the plurality of comparison voltages. This output digital data corresponds to a voltage to be converted.

A logarithmic D/A converter of the present invention includes a reference voltage generating unit, a selecting unit, and a multiplier. The reference voltage generating unit generates, using a multiplier that raises a predetermined voltage to the nth power, a plurality of reference voltages, of which a reference voltage is the nth power of another reference voltage. Each reference voltage corresponds to a different bit. In accordance with an inputted bit sequence, the selecting unit selects reference voltages. The multiplier performs multiplication using the selected reference voltages to generate an output voltage.

A logarithmic D/A conversion method of the present invention includes the following: raising a predetermined voltage to the nth power to generate reference voltages, of which a reference voltage is the nth power of another reference voltage, and each of which corresponds to a different bit; selecting the reference voltages in accordance with an inputted bit sequence; and performing multiplication using the selected reference voltages to perform D/A conversion.

A physical quantity measuring system according to the present invention includes a logarithmic A/D converter of the present invention.

BEST MODE FOR CARRYING OUT INVENTION

Devices and methods according to the present invention include a logarithmic A/D converter, a logarithmic A/D conversion method, a logarithmic D/A converter, a logarithmic D/A conversion method, and a physical quantity measuring system including the logarithmic A/D converter. With their simple circuit constructions, these devices are capable of providing a signal for which logarithmic conversion has been accurately performed.

The logarithmic A/D converter includes a reference voltage generating unit, a comparison voltage operating unit, and a comparator. The reference voltage generating unit generates, using at least one first multiplier that raises a predetermined voltage to the nth power, a plurality of reference voltages, of which a reference voltage value is the nth power of another reference voltage value. Based on at least one of the generated reference voltages, the comparison voltage operating unit generates a comparison voltage. Based on this comparison voltage, the comparator outputs a digital value corresponding to a voltage that has been converted.

This logarithmic A/D conversion method includes: generating a plurality of reference voltages, of which a reference voltage is the nth power of another reference voltage; generating a plurality of comparison voltages based on at least one of the reference voltages; and determining, based on the comparison voltages, a digital value to be outputted that corresponds to the voltage to be converted.

Figure 6:
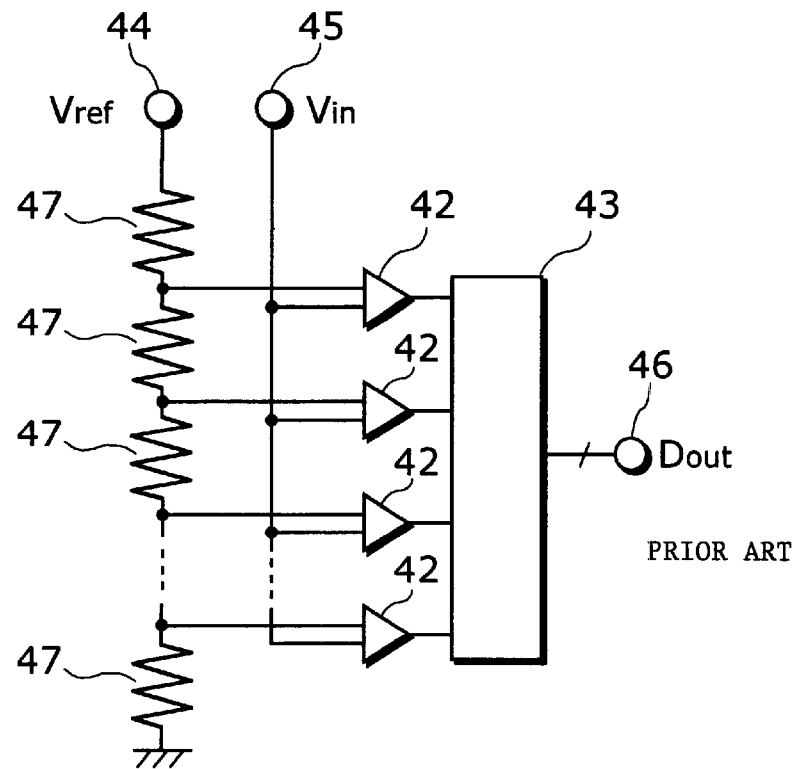
FIG. 6 is a circuit diagram showing an example of a conventional logarithmic A/D converter.

A conventional logarithmic A/D converter as shown in FIG. 6 divides a reference voltage "Vref" by using a plurality of resistors, and therefore has difficulty in accurately dividing the reference voltage "Vref". The logarithmic A/D converter and conversion method of the present invention, however, is capable of generating a plurality of comparison voltages with great accuracy based on which a digital value to be outputted is determined.

With the present A/D converter and the conversion method, a comparison voltage is generated by multiplying at least one of the reference voltages and a predetermined base voltage. This operation may be performed by a multiplier. The present A/D converter and method also allows the lowest reference voltage to be externally set. It is also possible for the reference voltage generating unit to generate a plurality of reference voltages by having multipliers raise a reference voltage to the nth power sequentially, starting from the lowest reference voltage. Furthermore, reference voltages to be sent to a second multiplier may be selected in order, and the comparator may sequentially compare a comparison voltage with a voltage to be converted to produce a digital value corresponding to this voltage to be converted.

A conventional logarithmic A/D converter outputs digital data represented by a sequence of values "0" and "1" that each are assigned to a digit, which is classified by a logarithm, of the digital data. Accordingly, a conventional logarithmic A/D converter cannot directly output a relative value such as a decibel value. With the A/D converter and conversion method of the present invention, however, it is possible to raise and lower, in accordance with a base voltage, a range (hereafter called an "A/D conversion range") of voltages for which A/D conversion can be performed and/or to output digital data represented by a decibel value of the base voltage. Especially when the first multiplier is a multiplier that raises an inputted voltage to its square, the present A/D converter and method can convert an inputted voltage directly to a decibel value. It is also possible to change, from the outside of the A/D converter, a resolution per bit used by the A/D converter. Moreover, the present A/D converter and method are simpler than conventional A/D converters and methods.

The logarithmic D/A converter of the present invention includes a reference voltage generating unit, a reference voltage selecting unit, and multipliers. By using at least one first multiplier that raises a predetermined voltage to the nth power, the reference voltage generating unit outputs a plurality of reference voltages, of which one voltage is the nth power of another voltage. Each of the plurality of reference voltages is associated with a different bit. In accordance with an inputted bit sequence, the reference voltage selecting unit selects reference voltages from the generated reference voltages associated with bits. A second multiplier then multiplies the selected reference voltages to output an output voltage for which D/A conversion has been performed.

The present D/A converter and the D/A conversion method are capable of generating a reference voltage for which logarithmic conversion has been accurately performed. It is also possible to change a resolution per bit from the outside of this D/A converter. In addition, the present D/A converter and method are simpler than conventional D/A converters and methods.

The following describes the logarithmic A/D converters and the A/D conversion methods according to the present invention in detail.

Figure 1:
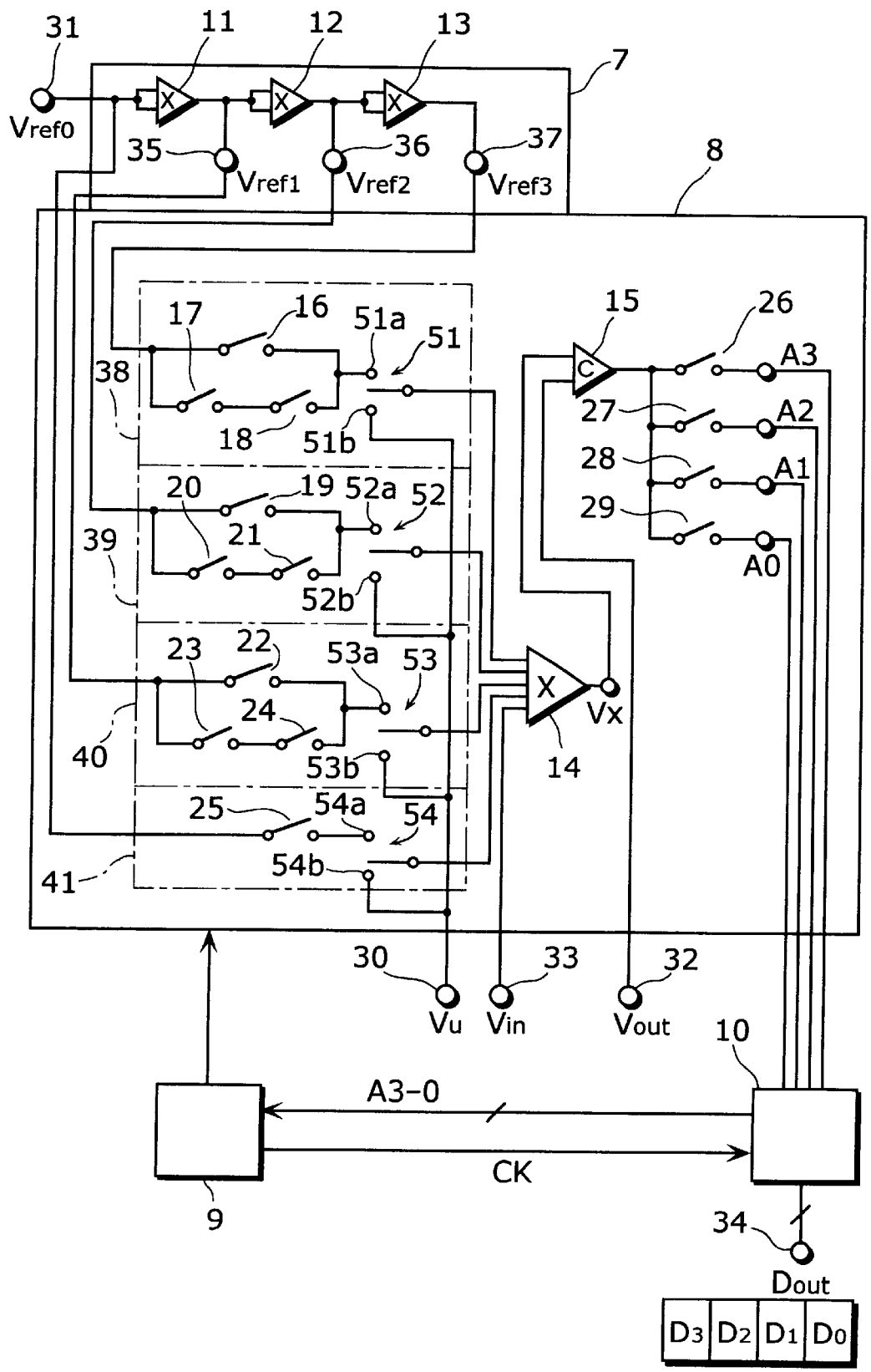
FIG. 1 is an example circuit diagram showing a logarithmic A/D converter of one embodiment according to the present invention.
Figure 8:
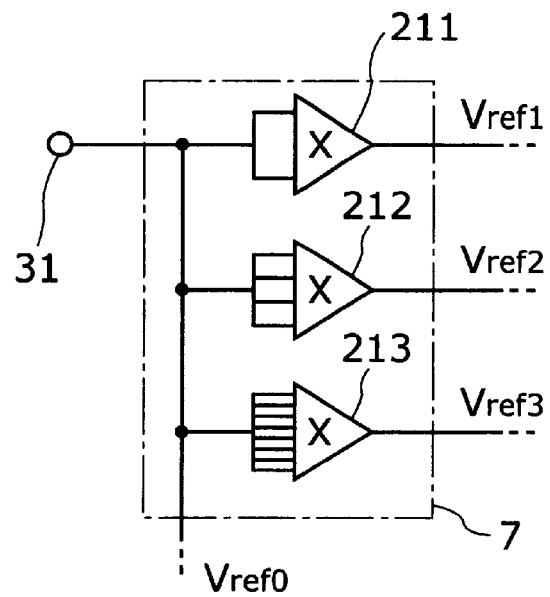
FIG. 8 shows an example circuit diagram showing part of a logarithmic A/D or D/A converter of another embodiment.
Figure 9:
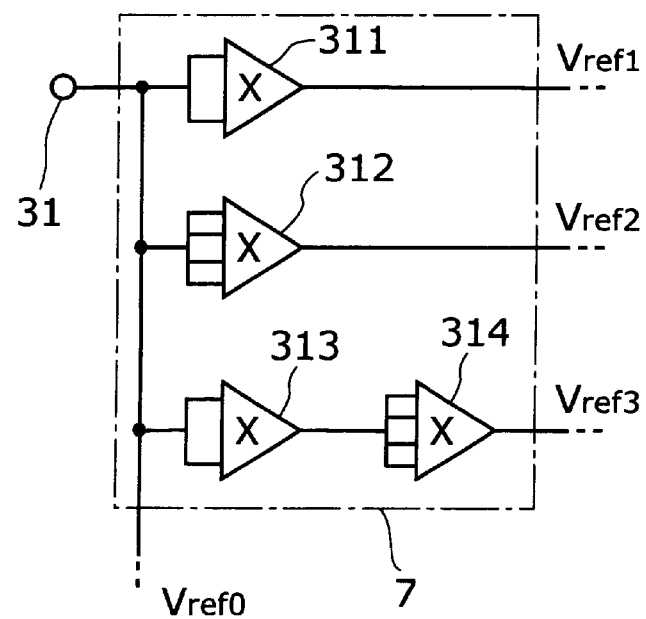
FIG. 9 shows an example circuit diagram showing part of a logarithmic A/D or D/A converter of another embodiment.

FIG. 1 is a circuit diagram showing an example embodiment of a logarithmic A/D converter according to the present Invention. This logarithmic A/D converter comprises the following major elements: a reference voltage generating unit 7; a voltage comparing unit 8; a timing circuit 9; and a data outputting circuit 10. This A/D converter outputs a 4-bit digital signal "Dout". An external power supply, such as a voltage generator that can adjust an amount of voltage, applies a reference voltage "Vref0" to a reference voltage input terminal 31 shown in the figure. Based on this reference voltage "Vref0", the least significant value of the digital signal "Dout" is determined. When an internal power supply is used, it is connected to the reference voltage input terminal 31. The reference voltage generating unit 7 includes three analog multipliers 11–13 that are connected in series. The analog multipliers 11–13 have two input terminals, and outputs reference voltages, of which a voltage outputted by a multiplier is a square of a voltage outputted by its adjacent multiplier (in other words, a voltage outputted by a multiplier is a square root of a voltage outputted by the next multiplier on the right in the figure). In this way, one reference voltage outputted by a multiplier is the nth power (n=2 for the present embodiment) of another reference voltage outputted by an adjacent multiplier. Both the input terminals of the analog multiplier 11 are connected to a reference voltage input terminal 31 that can be connected to the external power supply so that the lowest reference voltage can be changed freely. An output terminal of the analog multiplier 11 is connected to both the input terminals of the analog multiplier 12 and an output terminal of the analog multiplier 12 is connected to both the input terminals of the analog multiplier 13. The output terminals of the analog multipliers 11, 12, and 13 are also connected to reference voltage output terminals 35, 36, and 37, respectively. In the figure, three analog multipliers 11–13 are connected in series although the A/D converter of the present invention can be achieved using at least one analogue multiplier. Alternatively, the reference voltage generating unit 7 may include multipliers that are connected In parallel, or in a state that combines parallel and series connections as shown in FIGS. 8 and 9 so as to generate reference voltages having a "square relation" as described above.

The reference voltage input terminal 31 and the reference voltage output terminals 35–37 are connected to the voltage comparing unit 8. The voltage comparing unit 8 includes switches 16–29, selecting switches 51–54, an analog multiplier 14, and a comparator 15. The switches 17 and 18 are connected in series, and the switch 16 is connected in parallel with these switches 17 and 18. An output terminal of the switch 16 is connected to a first input terminal 51a of the selecting switch 51. The switches connected in this way make up a switch unit 38. Similarly, the switches 20–21 are connected in series, and the switch 19 is connected in parallel with these switches 20–21. An output terminal of the switch 19 is connected to a first input terminal 52a of the selecting switch 52. These switches connected in this way make up a switch unit 39. Furthermore, the switches 23–24 are connected in series, and the switch 22 is connected in parallel with these switches 23–24. An output terminal of the switch 22 is connected to a first input terminal 53a of the selecting switch 53. These switches make up a switch unit 40. A switch unit 41 is made up by the switch 25 and the selecting switch 54 whose first input terminal 54a is connected to an output terminal of the switch 25. The reference voltage output terminal 37 is connected to an input terminal of the switch unit 38, and the reference voltage output terminal 36 is connected to an input terminal of the switch unit 39. The reference voltage output terminal 35 is connected to an input terminal of the switch unit 40, and the reference voltage input terminal 31 is connected to an input terminal of the switch unit 41. Second input terminals 51b–54b of the selecting switches 51–54 are connected to a unit voltage terminal 30. These switches sequentially switch a reference voltage inputted to the multiplier 14. In the present embodiment, a voltage sequential selection unit is made up by switches. However, it may be made up by latches and multiplexers. For the present embodiment, the four switch units 38–41 connected in parallel constitute the sequential selection unit although the number of such switch units may be determined in accordance with a desired number of reference voltages generated by the reference voltage generating unit 7 and with required precision. Note that the A/D converter of the present invention can be achieved using at least two of such switch units.

In the present embodiment, the analog multiplier 14 receives five input voltages, and multiplies them to calculate a comparison voltage "Vx". Four output terminals of the switch units 38–41 are connected to four input terminals of the analog multiplier 14. The remaining input terminal of the multiplier 14 is connected to a base voltage input terminal. An output terminal of the analog multiplier 14 and a input terminal 32 for a voltage to be converted are connected to input terminals of the comparator 15. An output terminal of the comparator 15 is connected in parallel with switches 26–29, whose output terminals are connected to the data outputting circuit 10. The data outputting circuit 10 includes, for instance, a D-type flip-flop, latches, and registers although they are not shown to simplify the drawing. An output terminal of the data outputting circuit is connected to a data output terminal 34. In the present embodiment, the data outputting circuit 10 outputs a 4-bit digital signal "Dout" consisting of bits from the least significant bit "D0" to the most significant bit "D3". Signals A0–A3 are sent to the data outputting circuit 10 and the timing circuit 9. The timing circuit 9 outputs a latch signal "CK" to the data outputting circuit 10. The timing circuit 9 also generates, for instance, a pulse (see FIG. 2) to control the switch units 38–41 and the switches 26–29, and outputs the pulse to the voltage comparing unit 8. The timing circuit 9 includes a shift register and a latch register, for instance.

Figure 3:
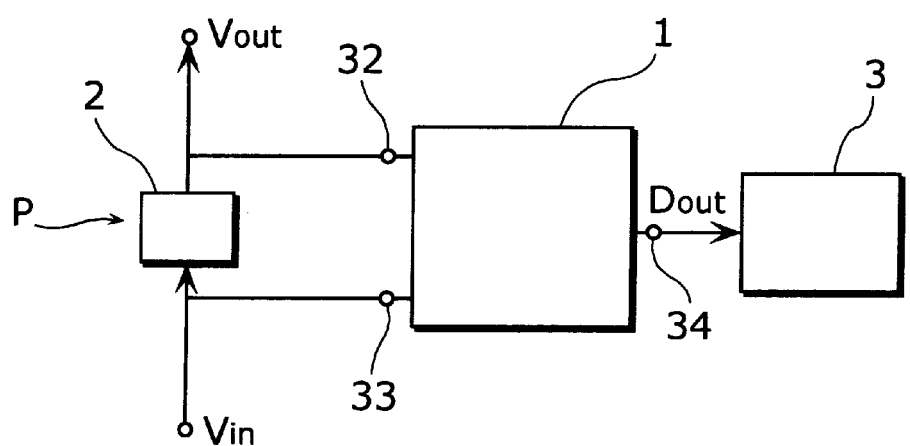
FIG. 3 is a block diagram showing an example of a measuring system that uses the logarithmic A/D converter shown in FIG. 1.

FIG. 3 shows a system for measuring a predetermined physical quantity "P" of, for instance, pressure, light, or temperature. This measuring system uses the above logarithmic A/D converter 1 and a sensor circuit 2. With the example of the figure, the sensor circuit 2 is a measured circuit, which receives a voltage "Vin", amplifies it to generate a voltage "Vout", and outputs the generated voltage "Vout". The gain varies according to the physical quantity "P" which is externally provided. That is to say, the physical quantity "P" can be measured by detecting this amplification rate. To do so, an input channel of the sensor circuit 2 is connected to the base voltage input terminal 33 of the logarithmic A/D converter 1, and the output channel of the sensor circuit 2 is connected to the input terminal 32 for a voltage to be converted of the A/D converter 1. The data output terminal 34 of the A/D converter 1 is connected to a display unit 3.

The following describes an example in which operations of the logarithmic A/D converter of the present invention are used in the above measuring system. A reference voltage "Vref0" is applied to the reference voltage Input terminal 31 shown in FIG. 1. This reference voltage "Vref0" is generated by an external power supply, such as a voltage generator capable of adjusting voltage, or by an internal power supply. In the present embodiment, the reference voltage "Vref0" is set so that the analog multiplier 14 outputs a voltage "Vx" that is $10^{0.05}$ times as high as a voltage "Vin" inputted to the sensor circuit 2 (i.e., the voltage "Vx" corresponds to +1 dB of the voltage "Vin") as a result of multiplying the voltage "Vref0" by the voltage "Vin". For ease of explanation, the analog multipliers 11–14 of the present embodiment are designed, when receiving 1 volt (V) and 2 V, for instance, to multiply the other input voltage by one and two, respectively. The analog multipliers 11–13 thus multiply two equal input voltage values to output a voltage that is a square of each of two input voltages. The analog multiplier 14 multiplies two or more input voltage values, and outputs the result of the multiplication.

In the present embodiment, the reference voltage "Vref0" is first set as $10^{0.05}$ V, and then raised by the analog multiplier 11 to its square. As a result, the reference voltage output terminal 35 outputs a reference voltage "Vref1" equal to $10^{0.1}$ V. Following this, the reference voltage "Vref1" is raised by the analog multiplier 12 to its square, so that the reference voltage output terminal 36 outputs $10^{0.2}$ V as a reference voltage "Vref2". The reference voltage "Vref2" is then raised by the analog multiplier 13 to its square, so that the reference voltage output terminal 37 outputs $10^{0.4}$ V as a reference voltage "Vref3". That is to say, the reference voltage generating unit 7 sequentially generates a plurality of reference voltages "Vref1" to "Vref3" by having the analog multipliers 11–13 raise voltages "Vref0" to "Vref2", respectively, to their respective second powers so that one reference voltage is a square of another adjacent reference voltage. Multipliers of these reference voltages "Vref0" to "Vref3" form an arithmetical progression. Multipliers of reference voltages form an arithmetical progression also when "n" in the nth power is 3 or higher in other embodiments as shown in Table 1.

In order to prevent zero output of the analog multiplier, a unit voltage "Vu" (1 V for the present embodiment) that multiplies other voltages inputted to the multiplier 14 by one is applied to the unit voltage terminal 30. Furthermore, the voltage "Vin" inputted to the sensor circuit 2 is applied as a base voltage "Vin" to the base voltage input terminal 33. The base voltage "Vin" is provided by an external or internal variable power supply (not shown in the figure), and set as an optimal value so as to achieve the highest possible measuring precision by adjusting the sensitivity of the sensor. The voltage "Vout" outputted by the sensor circuit 2 is applied as a voltage "Vout" to be converted to the input terminal 32 for a voltage to be converted.

Figure 2:
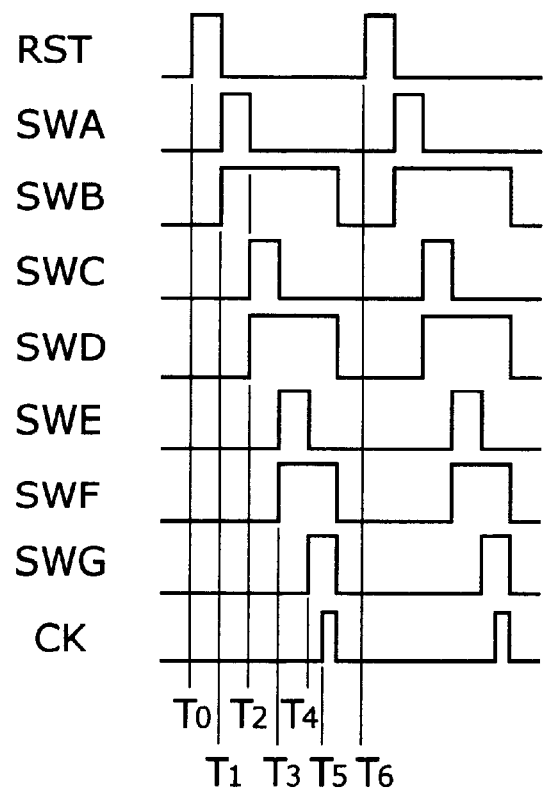
FIG. 2 is an example timing chart showing pulse signals outputted from a timing circuit shown in FIG. 1.

With the above state set in the A/D converter, the timing circuit 9 applies pulses as shown in a timing chart of FIG. 2 to the voltage comparing unit 8 and the data outputting circuit 10. At time "T0", a signal "RST" is set at high. This makes the switches 16–29 off, and all the selecting switches 51–54 select the second input terminal 51b–54b. At time "T1", signals "SWA" and "SWB" are set at high. The high signal "SWA" makes the "RST" signal low, makes the switches 16 and 26 on, and has the selecting switch 51 select the first input terminal 51a. The high signal "SWB" makes the switch 18 on. As a result, the analog multiplier 14 receives five inputs consisting of the reference voltage "Vref3", three unit voltages "Vu", and the base voltage "Vin". As a result, the analog multiplier 14 outputs a comparison voltage "Vx" equal to $10^{0.4}$ multiplied by the base voltage "Vin". The comparator 15 then compares the comparison voltage "Vx" with the voltage "Vout" to be converted. When an expression "Vout"≧"Vx" is satisfied, an output of the comparator 15 is set at high, and the output terminal of the switch 26 outputs a signal "A3" set at high. This high signal "A3" is then sent to the data outputting circuit 10. When an expression "Vout"<"Vx" is satisfied, on the other hand, the output of the comparator 15 remains low, so that the low signal "A3" is sent to the data outputting circuit 10. The signal "A3" is temporarily stored in the data outputting circuit 10, and also sent to the voltage comparing unit 8 via the timing circuit 9. When the voltage comparing unit 8 receives the signal "A3" set at high, the switch 17 is switched on, and the selecting switch 51 remains selecting the first input terminal 51a. On the other hand, when the voltage comparing unit 8 receives the signal "A3" set at low, the switch 17 is switched off, and the selecting switch 51 selects the second input terminal 51b. Here, assume that voltage "Vout" to be converted is, for instance, $10^{0.53}$ multiplied by the base voltage "Vin". That is to say, the comparison voltage "Vx" corresponds to +10.6 dB of the base voltage "Vin". As a result, the signal "A3" is set at high, so that the switch 17 becomes on, and the selecting switch 51 selects the first input terminal 51a.

At time "T2", the signal "SWB" remains high, and the signal "SWA" is set at low. At the same time, signals "SWC" and "SWD" are set at high. The high signal "SWC" makes the switches 19 and 27 on, and has the selecting switch 52 select the first input terminal 52a. The high signal "SWD" makes the switch 21 on. At this moment, the switches 17, 18, 19, and 27 are all on. As a result, the analog multiplier 14 receives five inputs consisting of "Vref3", "Vref2", "Vu", "Vu", and "Vin". The analog multiplier 14 therefore outputs a comparison voltage "Vx" equal to $10^{0.6}$ multiplied by the base voltage "Vin". The comparator 15 then compares the comparison voltage "Vx" with the voltage "Vout" to be converted. When the expression "Vout" >"Vx" is satisfied, a signal "A2" set at high is sent to the data outputting circuit 10. When the expression "Vout" <"Vx" is satisfied, on the other hand, the low signal "A2" is sent to the data outputting circuit 10. The signal "A2" is temporarily stored in the data outputting circuit 10, and also sent to the voltage comparing unit 8 via the timing circuit 9. When the voltage comparing unit 8 receives the signal "A2" set at high, the switch 20 is switched on, and the selecting switch 52 remains selecting the first input terminal 52a. On the other hand, when the voltage comparing unit 8 receives the signal "A2" set at low, the switch 20 is switched off, and the selecting switch 52 selects the second input terminal 52b. When the voltage "Vout" to be converted is $10^{0.53}$ multiplied by the base voltage "Vin" as assumed earlier, the signal "A2" is set at low, so that the switch 20 is switched off, and the selecting switch 52 selects the second input terminal 52b.

At time "T3", the signals "SWB" and "SWD" remain high, and the signal "SWC" is set at low. At the same time, signals "SWE" and "SWF" are set at high. The high signal "SWE" makes the switches 22 and 28 on, and has the selecting switch 53 select the first input terminal 53a. The high signal "SWF" makes the switch 24 on. In this state, the switches 17, 18, 21, 22, 24, and 28 are all on. As a result, the analog multiplier 14 receives five inputs consisting of "Vref3", "Vu", "Vref1", "Vu", and "Vin". The analog multiplier 14 therefore outputs a comparison voltage "Vx" equal to $10^{0.5}$ multiplied by the base voltage "Vin". The comparator 15 then compares this comparison voltage "Vx" with the voltage "Vout" to be converted. When the expression "Vout"≧"Vx" is satisfied, a signal "A1" set at high is sent to the data outputting circuit 10. When the expression "Vout"<"Vx" is satisfied, on the other hand, a low signal "A1" is sent to the data outputting circuit 10. The signal "A1" is temporarily stored in the data outputting circuit 10, and also sent to the voltage comparing unit 8 via the timing circuit 9. When the voltage comparing unit 8 receives the signal "A1" set at high, the switch 23 is switched on, and the selecting switch 53 remains selecting the first input terminal 53a. On the other hand, when the voltage comparing unit 8 receives the signal "A1" set at low, the switch 23 is switched off, and the selecting switch 53 selects the second input terminal 53b. When the voltage "Vout" to be converted is $10^{0.53}$ multiplied by the base voltage "Vin" as assumed earlier, the signal "A1" is set at high, so that the switch 23 is switched on, and the selecting switch 53 selects the first input terminal 53a.

At time "T4", the signals "SWB", "SWD", and "SWF" remain high, and the signal "SWE" is set at low. At the same time, a signal "SWG" is set at high. The high signal "SWG" sets the switches 25 and 29 on, and has the selecting switch 54 select the first input terminal 54a. In this state, the switches 17, 18, 21, 23, 24, 25, and 29 are all on. As a result, the analog multiplier 14 receives five inputs consisting of "Vref3", "Vu", "Vref1", "Vref0", and "Vin". The analog multiplier 14 therefore outputs a comparison voltage "Vx" equal to $10^{0.55}$ multiplied by the base voltage "Vin". The comparator 15 then compares this comparison voltage "Vx" with the voltage "Vout" to be converted. When the expression "Vout" >"Vx" is satisfied, a signal "A0" is set at high, and sent to the data outputting circuit 10. When the expression "Vout" <"Vx" is satisfied, on the other hand, the low signal "A0" is sent to the data outputting circuit 10. When the voltage "Vout" to be converted is $10^{0.53}$ multiplied by the base voltage "Vin" as assumed earlier, the signal "A0" is set at low, and stored in the data outputting circuit 10 temporarily.

The switches 26, 27, 28, and 29, which are an example of a sequential output unit, operate sequentially in accordance with time "T1" to "T4", and output a four-bit digital value to the data outputting circuit 10.

Results of arithmetic operations based on the above example show that exponents (multipliers) of comparison voltages "Vx", that is, exponents of the lowest reference voltage "Vref0" (=$10^{0.05}$≈1.122 when "n" in the nth power is "2") form an arithmetical progression. Table 1 shows this and other results obtained when "n" is equal to "3" and "4".

TABLE 1

|  |  | n = 2 | dB | n = 3 | dB | n = 4 | dB |
|---|---|---|---|---|---|---|---|
| REFERENCE | Vref0 | $10^{0.05}$ | 1 | $10^{0.05}$ | 1 | $10^{0.05}$ | 1 |
| VOLTAGE | Vref1 | $10^{0.1}$ | 2 | $10^{0.15}$ | 3 | $10^{0.2}$ | 4 |
|  | Vref2 | $10^{0.2}$ | 4 | $10^{0.45}$ | 9 | $10^{0.8}$ | 16 |
|  | Vref3 | $10^{0.4}$ | 8 | $10^{1.35}$ | 27 | $10^{3.2}$ | 64 |
| COMPARISON |  | $10^{0}$ | 0 |  |  |  |  |
| VOLTAGE |  | $10^{0.05}$ | 1 |  |  |  |  |

TABLE 1-continued

| n = 2 | dB | n = 3 | dB | n = 4 | dB |
|---|---|---|---|---|---|
| $10^{0.10}$ | 2 | | | | |
| $10^{0.15}$ | 3 | | | | |
| $10^{0.20}$ | 4 | | | | |
| $10^{0.25}$ | 5 | | | | |
| $10^{0.30}$ | 6 | | | | |
| $10^{0.35}$ | 7 | | | | |
| $10^{0.40}$ | 8 | | | | |
| $10^{0.45}$ | 9 | | | | |
| $10^{0.50}$ | 10 | | | | |
| $10^{0.55}$ | 11 | | | | |
| $10^{0.60}$ | 12 | | | | |
| $10^{0.65}$ | 13 | | | | |
| $10^{0.70}$ | 14 | | | | |
| $10^{0.75}$ | 15 | | | | |

Figure 4:
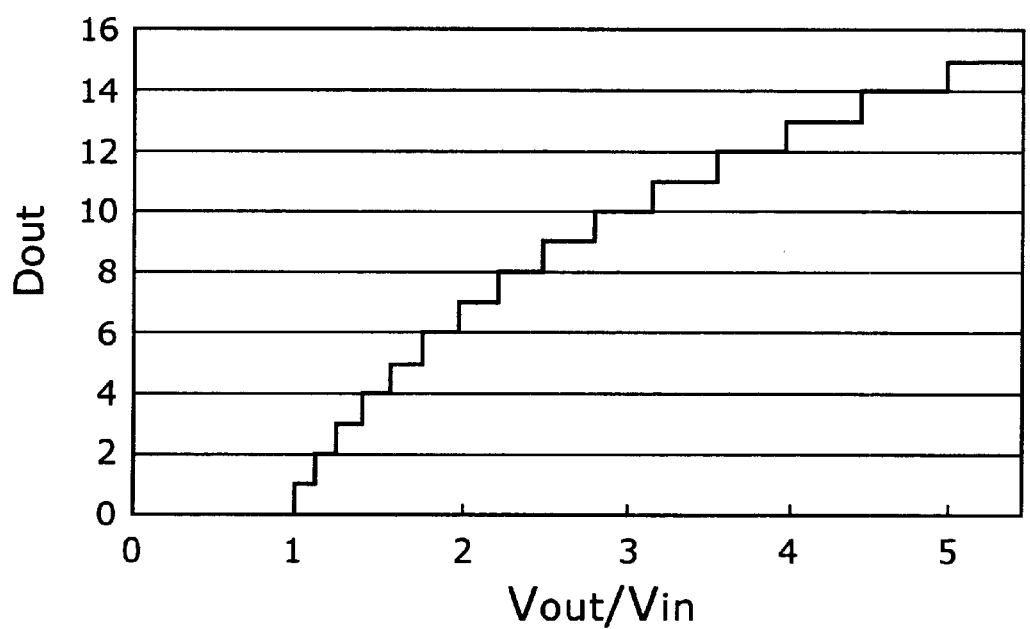
FIG. 4 is a graph showing example data outputted by the logarithmic A/D converter shown in FIG. 1.

At time "t5", a latch signal "CK" is set to high, so that a bit sequence consisting of signals "A0" to "A3" stored in the data outputting circuit 10 is latched by a latch resister. The data output terminal 34 then outputs a digital signal "Dout" showing a binary value "1010" to the display unit 3. The binary value "1010" represents "10" in decimal notation, and the display unit 3 displays a value "10 dB". This value indicates the physical quantity "P" detected in the sensor circuit 2. From time "T6" onward, operations at time "T0" to "T5" are repeated, and the next digital signal "Dout" is obtained. FIG. 4 is a graph showing a relationship between a value of a digital signal "Dout" and a "Vout"-to-"Vin" ratio obtained in the present embodiment. As shown in the figure, the "Vout"-to-"Vin" ratio is outputted as a decibel value. For instance, a digital signal "Dout" shown as "0000", that is, 0 dB is outputted when the "Vout"-to-"Vin" ratio is equal to "1". A digital signal "Dout" shown as "0110", that is, 6 dB is outputted when the "Vout"-to-"Vin" ratio is equal to "2". A digital signal "Dout" shown as "1100", that is, 12 dB is outputted when the "Vout"-to-"Vin" ratio is equal to "4". For the present embodiment, the digital signal "Dout" consists of 4 bits, and therefore 15 dB is the maximum measurable value although the maximum measurable value can be increased to 255 dB by using 8 bits, for instance, for the digital signal. The above number of bits making up the digital signal "Dout" is only an example, and can be changed in accordance with a required precision.

For the present embodiment, the reference voltages "Vref1" to "Vref3" are generated not by dividing voltage using resistors but by having the analog multipliers 11–13 multiply (raise to the second power, for the above example) the lowest reference voltage "Vref0" in order. This reduces a circuit size of the reference voltage generating unit 7, and generates a more accurate reference voltage than when the resistors are used. In addition, as multiplication is performed using the reference voltages "Vref0" to "Vref3", different comparison voltages "Vx" that are apart from one another at intervals of logarithms can be accurately generated. Moreover, as the logarithmic A/D converter of the present invention is less dependent on temperature characteristics, it can generate an accurate comparison voltage "Vx" with stability and perform logarithmic A/D conversion with great precision. Values of the reference voltages "Vref1" to "Vref3" are determined based on the reference voltage "Vref0" corresponding to the lowest bit (signal "A0"). This reference voltage "Vref0" therefore determines a sequence of a comparison voltage "Vx". Accordingly, it is possible to change, from the outside of the present logarithmic A/D converter, intervals of comparison voltages "Vx", that is, a resolution assigned to each bit in the A/D conversion by changing a voltage applied to the reference voltage input terminal 31. When this voltage externally applied to the reference voltage input terminal 31 is raised, the resolution becomes large, and it becomes small when the applied voltage is lowered. In this way, the present invention allows a resolution in the A/D conversion to change freely.

With the logarithmic A/D converter of the present embodiment, the analog multiplier 14 multiplies the reference voltages "Vref0" to "Vref3" and the base voltage "V1" inputted to the sensor circuit 2. As a result, a comparison voltage "Vx" is generated, and the comparator 15 compares the generated comparison voltage "Vx" with the voltage "Vout" to be converted outputted from the sensor circuit 2. This is to say, the comparison voltage "Vx" is generated by multiplying the base voltage "Vin" and at least one of the reference voltages "Vref0" to "Vref3". Since a value of a digital signal "Dout" is determined by comparing this comparison voltage "Vx" with the voltage "Vout" to be converted as described in the above embodiment, the digital signal "Dout" is outputted as a decibel value of the voltage "Vout" to be converted in relation to the base voltage "Vin". By setting the reference voltage "Vref0" and the base voltage "Vin" so as to satisfy an expression "Vx"= $10^{0.05}$*"Vin" as a result of multiplication of the reference voltage "Vref0" and the base voltage "Vin" by the analog multiplier 14 as in the above embodiment, it becomes possible to associate the lowest bit "D0" with 1 dB, the intermediate bits "D1" and "D2" with 2 dB and 4 dB, respectively, and the highest bit "D3" as 8 dB. Accordingly, for the present embodiment, a value of a digital signal "Dout" can be used as a decibel value to be displayed, so that a dedicated signal processing circuit is unnecessary. This simplifies the construction of the measuring system that uses the present logarithmic A/D converter. With the present invention, it is possible to change bias by changing the base voltage "Vin", and an A/D conversion range is expanded and shortened in accordance with the bias. These features are not limited to the examples described above, and can be obtained through other embodiments according to the present invention.

Figure 7:
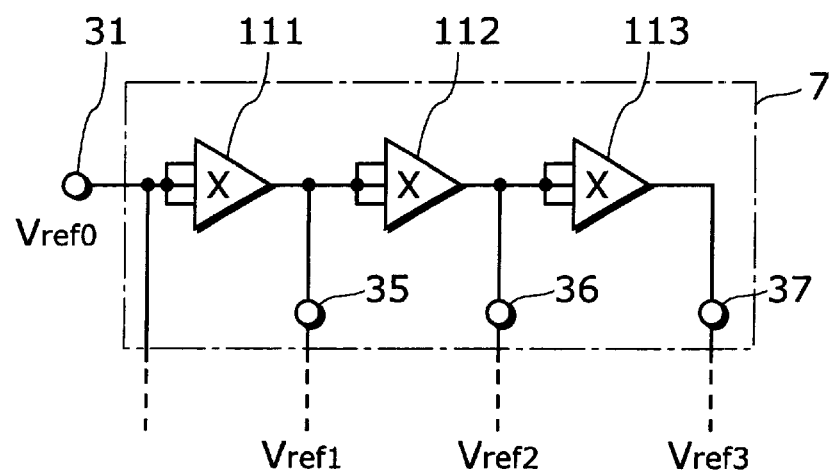
FIG. 7 shows an example circuit diagram showing part of a logarithmic A/D or D/A converter of another embodiment.

FIGS. 7–9 show examples for which the analog multipliers 11, 12, and 13 with two input terminals used in the reference voltage generating unit 7 of the above embodiment are replaced with multipliers 111–113, 211–213, and 311–314 that have different constructions from the multipliers 11–13. Units and circuits other than the multipliers 11–13 are the same as those described in the above embodiment, and are therefore not shown. For instance, when the multiplies 111–113 having three input terminals are used as shown in FIG. 7, the A/D conversion range is enlarged. Table 1 shows changes in reference voltages "Vref0" to "Vref3" when n in the nth power is equal to "3", as in the figure, and "4" (such as when the multipliers with three input terminals and four input terminals, respectively, are used) with the assumption that the reference voltage "Vref0" is $10^{0.05}$ V. The analog multipliers 11–13 can be replaced with those having more input terminals like three, four, five, and n terminals (for raising an input voltage to its nth power), and the A/D conversion range is enlarged in accordance with the number of input terminals.

FIG. 8 shows the multiplier 211 with two input terminals, the multiplier 212 with four terminals, and the multiplier 213 with eight terminals. The multipliers 211–213 are connected in parallel with the reference voltage "Vref0". This construction generates four reference voltages, of which one voltage value is a square of another. FIG. 9 shows the multiplier 311 with two input terminals, the multiplier 312 with four input terminals, and the multiplier 313 with two input terminals, all of which are connected in parallel with the reference voltage "Vref0". The multiplier 313 with two input terminals is also connected in series with the multiplier 314 with four input terminals. This construction also generates four reference voltages, of which one voltage is a square of another. FIGS. 8 and 9 show constructions containing three stages of the multipliers although the number of stages may be four or more in accordance with necessity in designing.

In the above embodiment, the reference voltage "Vref0" and the base voltage "Vin" are set so as to satisfy an expression "Vx"=$10^{0.05}$*"Vin" when the reference voltage "Vref0" and the base voltage "Vin" are multiplied by the analog multiplier 14. This allows a resolution per bit to be 1 dB. As stated earlier, however, the resolution can be changed in accordance with required precision. For instance, if the reference voltage "Vref0" and the base voltage "Vin" are set so as to satisfy an expression "Vx"=$10^{0.1}$*"Vin" when they are multiplied by the analog multiplier 14, the resolution per bit becomes 2 dB. In this way, the resolution for the present invention can be changed by changing a value of a reference voltage "Vref0" supplied via the reference voltage input terminal 31. Different values of reference voltages "Vref0" may be provided in advance inside the A/D converter, and one of the reference voltages "Vref0" may be selected under the control outside the A/D converter. As shown in FIG. 7, the use of multipliers 111–113 with three or more input terminals enlarges the full-scale of the A/D converter, and achieves a resolution with even greater precision.

In the above embodiment, the base voltage "Vin" is inputted to the multiplier 14, and multiplied by reference voltages "Vref0" to "Vref3". This generates a digital signal "Dout" as a relative value to the base voltage "Vin". It is alternatively possible that the analog multiplier 14 is constructed as not receiving the base voltage "Vin", or that the unit voltage "Vu", instead of the base voltage "Vin", is inputted to the multiplier 14. In this case, the result of multiplying the reference voltages "Vref0" to "Vref3" is directly used as a comparison voltage "Vx". When this comparison voltage "Vx" and the voltage "Vout" to be converted are compared, a digital signal "Dout" can be outputted as an absolute value.

In the above embodiment, comparison of a plurality of comparison voltages "Vx" with the voltage "Vout" to be converted is sequentially performed by switching the switches 16–29 on and off according to pulses shown in FIG. 2. This is only an example of the sequential comparison, however, and it is of course possible to perform such sequential comparison based on other algorithms.

Figure 5:
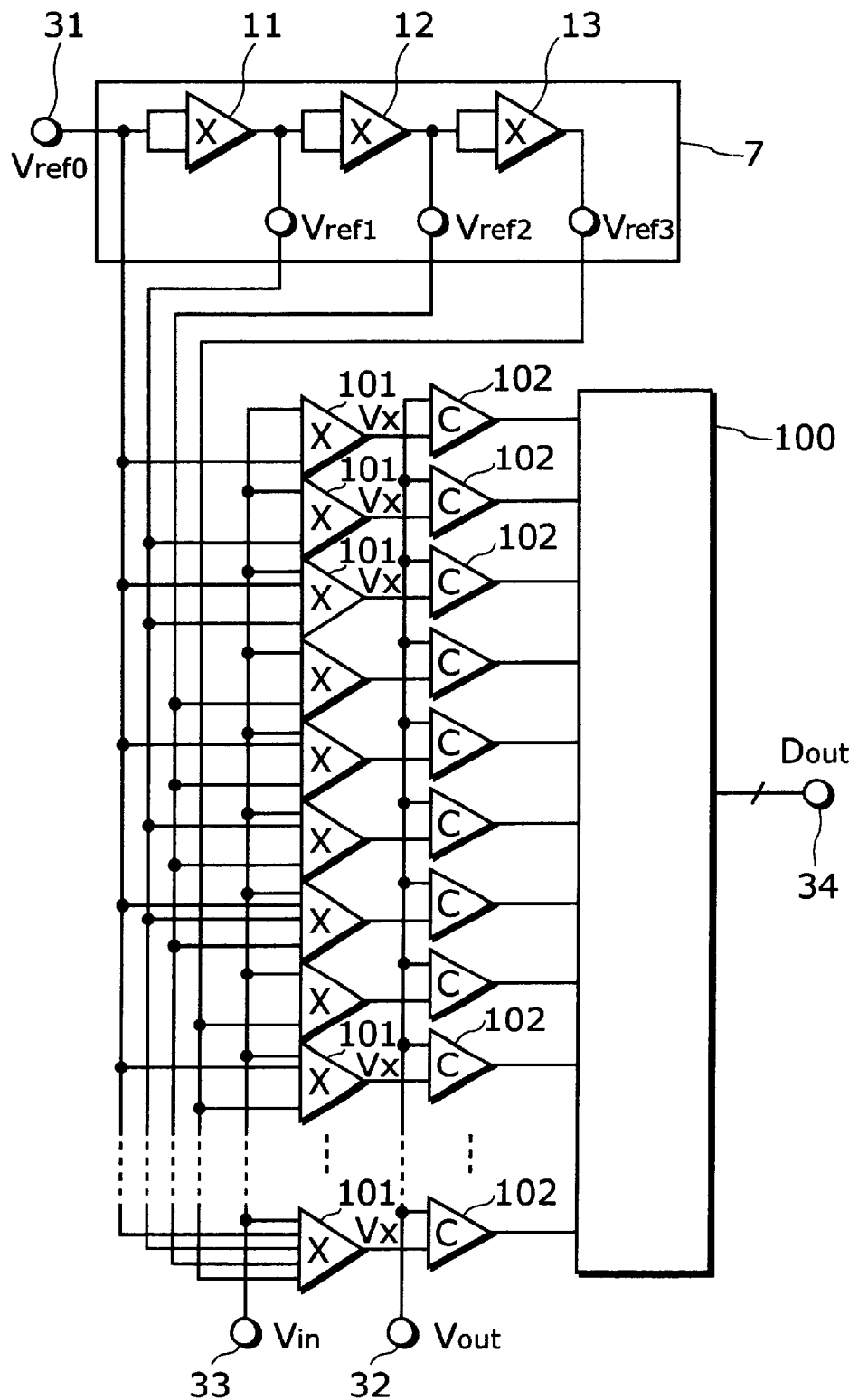
FIG. 5 is an example circuit diagram showing a logarithmic A/D converter of another embodiment according to the present invention.

The above embodiment shows the logarithmic A/D converter that performs the sequential comparison. However, the logarithmic A/D converter of the present invention may perform parallel comparison (constant comparison) instead of the sequential comparison. FIG. 5 is a circuit diagram showing an example construction of the logarithmic A/D converter of the parallel comparison type. This A/D converter also outputs a 4-bit digital signal "Dout" as one example. The reference voltage generating unit 7 shown in the figure is basically the same as that shown in FIG. 1. A reference voltage "Vref0" is applied to the reference voltage input terminal 31 shown in FIG. 5, and sequentially raised to a square by the multipliers 11, 12, and 13 to generate reference voltages "Vref1" "Vref2", and "Vref3". In accordance with bit sequences from a sequence "0,0,0,1" to a sequence "1,1,1,1", voltages are selected from the generated reference voltages "Vref0" to "Vref3" to produce fifteen types of voltage combinations. The voltage combinations are inputted to fifteen multipliers 101. Each multiplier 101 also receives a base voltage "Vin" applied to the base voltage input terminal 33. Consequently, the fifteen multipliers 101, which correspond to bit sequences from a sequence "0,0,0,1" to a sequence "1,1,1,1", output different comparison voltages "Vx"in parallel. The comparison voltages "Vx" and the voltage "Vout" to be converted are sent to fifteen comparators 102 provided corresponding to the fifteen multipliers 101. Each of the comparators 102 compares a comparison voltage "Vx" with the voltage "Vout" to be converted, and outputs a signal set at either high or low. Fifteen such signals are outputted in parallel from the comparators 102 to a decoder 100. The decoder 10 converts these signals into a 4-bit digital signal "Dout" in binary code. The digital signal "Dout" is then outputted from the data output terminal 34.

This logarithmic A/D converter shown in FIG. 5 differs from the A/D converter of the sequential comparison type shown in FIG. 1 in that a plurality of multipliers 101 simultaneously output comparison voltages "Vx", which are then compared with the voltage "Vout" to be converted in parallel, although the multiplier 14 shown in FIG. 1 sequentially outputs a comparison voltage "Vx" to be sequentially compared with the voltage "Vout" to be converted. Accordingly, if its larger circuit size is not a problem, this A/D converter shown in FIG. 5 may be useful since it is capable of performing high-speed logarithmic A/D conversion.

Figure 10:
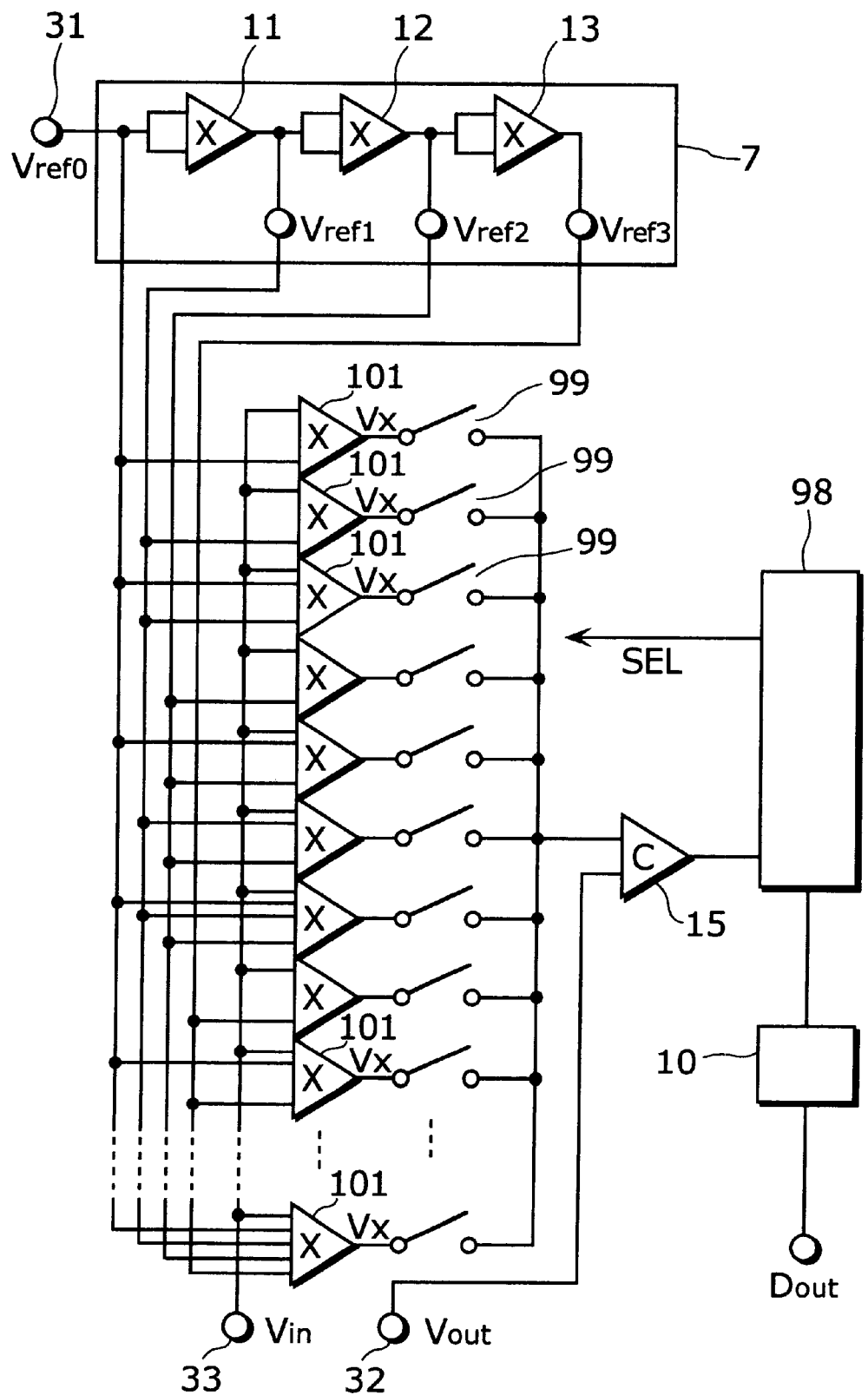
FIG. 10 shows an example circuit diagram showing a logarithmic A/D converter of another embodiment.

FIG. 10 is a circuit diagram showing an example of another logarithmic A/D converter that has advantages of both the A/D converter of the sequential comparison type and that of the parallel comparison type. This A/D converter also outputs a 4-bit digital signal "Dout" as one example. The reference voltage generating unit 7 shown in the figure is basically the same as that of the sequential comparison type shown in FIG. 1. A reference voltage "Vref0" is applied to the reference voltage input terminal 31 shown in FIG. 10, and raised to a square in order by the multipliers 11, 12, and 13 to generate reference voltages "Vref1", "Vref2", and "Vref3". In accordance with bit sequences from "0,0,0,1" to "1,1,1,1", voltages are selected from the reference voltages "Vref0" to "Vref3" to produce fifteen types of voltage combinations. The combinations of the voltages are sent to multipliers 101. Each multiplier 101 also receives a base voltage "Vin" applied to the base voltage input terminal 33. The multipliers 101 sequentially output a multiplication result (a comparison voltage "Vx") to a single comparator 15 via switches 99, which function as a sequential output unit for the comparison voltage "Vx". In this example, the sequential output unit for a comparison voltage "Vx" is achieved by the switches as one example although the switches may be replaced with such devices as multiplexers and latches that are capable of switching their outputs in order. In this way, the fifteen multipliers 101 generate different comparison voltages "Vx", and sequentially output them in accordance with bit sequences from "0,0,0,1" to "1,1,1,1". The comparator 15 compares each comparison voltage "Vx" with the voltage "Vout" to be converted, and sequentially outputs a comparison result as a signal that is set at either high or low. Based on this signal and a control signal "SEL" for switching the switches 99 on and off, a 4-bit digital signal "Dout" in binary code is generated by a decoder 98, and sent to the data outputting circuit 10.

This logarithmic A/D converter shown in FIG. 10 differs from the A/D converter of the sequential comparison type shown in FIG. 1 in that with the A/D converter shown in FIG. 10 a comparison voltage "Vx" is not sequentially outputted by the sole multiplier 14 and not sequentially compared with the voltage "Vout" to be converted in a simple manner shown in FIG. 1. This logarithmic A/D converter shown in FIG. 10 also differs from the A/D converter of the parallel comparison type in that, with the A/D converter shown in this figure, different comparison voltages "Vx" are not simultaneously outputted by the plurality of multipliers 101 to be compared with the voltage "Vout" to be converted in parallel. If its relatively larger circuit is not a problem but a small size is still required, this A/D converter may be useful as it is capable of performing A/D conversion relatively fast.

Figure 11:
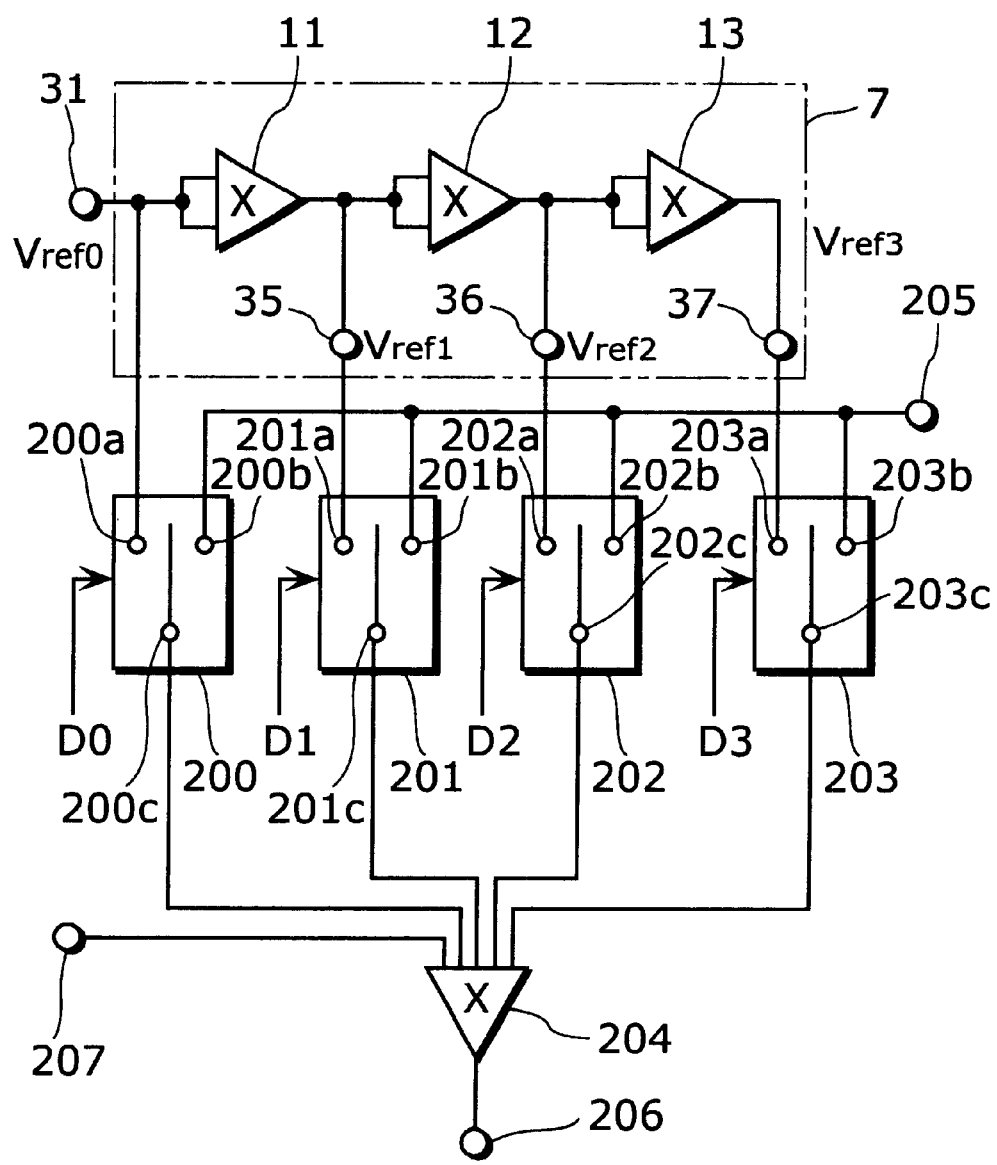
FIG. 11 shows an example circuit diagram showing a logarithmic D/A converter of another embodiment.

FIG. 11 shows an example of a logarithmic D/A converter that uses the technological concept of the present invention. This D/A converter includes a reference voltage generating unit 7 containing multipliers 11–13. This reference voltage generating unit 7 has the same construction as that shown in FIG. 1, and so will not be described. The same reference numbers as those used in FIG. 1 are used for elements, which are common to FIG. 1 and FIG. 11, of the reference voltage generating unit 7. As shown in the figure, an input terminal of the multiplier 11 is connected to a second terminal 200a of a selector 200. Likewise, an input terminal of the multiplier 12 is connected to a second terminal 201a of a selector 201. An input terminal of the multiplier 13 is connected to a second terminal 202a of a selector 202, and an output terminal 37 of the same multiplier 13 is connected to a second terminal 203a of a selector 203. In this way, a reference voltage selecting unit of this D/A converter is achieved by the selectors 200–203 and other elements. First terminals 200c–203c of the selectors 200–203 are connected to four input terminals out of five input terminals of an analog multiplier 204. For ease of explanation, this analog multiplier 204 is designed as follows. When receiving 1 V, the multiplier 204 multiplies other voltages it receives by one. When receiving 2 V, the multiplier 204 multiplies other voltages it receives by two. The remaining input terminal of the multiplier 204 is connected to a base voltage input terminal 207. Other second terminals 200b–203b of the selectors 200–203 are connected to a unit voltage terminal 205. A voltage (1 V for this D/A converter) that is used by the analog multiplier 204 for multiplying other voltages by one is applied to the unit voltage terminal 205. An output terminal of the analog multiplier 204 is connected to the voltage output terminal 206. The analog multiplier 204 is shown as one example of a multiplier that generates an output voltage in this way.

The selectors 200–203 are controlled by inputted digital data. For the selector 200, the first terminal 200c is connected to the second terminal 200b and to the second terminal 200a when the lowest bit "D0" of the inputted digital data is shown as "0" and "1", respectively. For the selector 201, the first terminal 201c is connected to the second terminal 201b and to the second terminal 201a when the second-lowest bit "D1" of the digital data is shown as "0" and "1", respectively. Similarly, the selectors 202 and 203 are controlled by the second-highest bit "D2" and the highest bit "D3", respectively.

Here, assume that the reference voltage "Vref0" is $10^{0.05}$ V and that the base voltage "Vin" is 2 V. If the inputted digital data is shown as "0001", the voltage output terminal 206 then outputs a voltage of $2*10^{0.05}$ V (i.e., a voltage corresponding to 1 dB of the base voltage "Vin"). If the inputted digital data is shown as "0010", the voltage output terminal 206 outputs a voltage of $2*10^{0.1}$ V (i.e., a voltage corresponding to 2 dB of the base voltage "Vin"). If the inputted digital data is shown as "0011", the voltage output terminal 206 outputs a voltage of $2*10^{0.15}$ V (i.e., a voltage corresponding to 3 dB of the base voltage "Vin"). With this D/A converter, inputted voltage as a decibel value of the base voltage "Vin" is outputted from the voltage output terminal 206 after D/A conversion, and the inputted voltage corresponds to inputted digital data. As this decibel conversion is performed by multiplication with the multiplier 204, the accurate output voltage can be obtained. In addition, fluctuations in the output voltage value corresponding to the inputted digital data can be raised or lowered by changing the value of the reference voltage "Vref0" applied to the reference voltage input terminal 31. For instance, when the reference voltage "Vref0" is set as $10^{0.01}$, the voltage output terminal 206 outputs a voltage corresponding to a decibel value (to the base voltage "Vin"), for which the inputted digital value is multiplied by two. It is also possible to increase the number of input terminals of the multipliers 11–13 to three, four, five, . . . n terminals (i.e., nth power), in accordance with which D/A conversion range increases. This D/A converter achieves almost the same advantages as the logarithmic A/D converters described above.

Although the present invention has been specifically described, it should be noted that this specification only shows example embodiments that do not limit the present invention. The concept and scope of the present invention should be only limited by claims attached hereto.

What is claimed is:

1. A logarithmic A/D converter, comprising:
    a reference voltage generating unit that includes at least one first multiplier that raises a predetermined inputted reference voltage to an nth power;
    a comparison voltage operating unit that is connected to at least one output terminal of said reference voltage generating unit to select a reference voltage; and
    a comparator connected to an output terminal of the comparison voltage operating unit for receiving the selected reference voltage and to an input terminal for a voltage to be converted.

2. The logarithmic A/D converter of claim 1,
    wherein the comparison voltage operating unit includes a second multiplier connected to a base voltage input terminal that receives a predetermined base voltage.

3. The logarithmic A/D converter of claim 2, further comprising:
    a reference voltage input terminal for receiving the inputted reference voltage as a lowest reference voltage that can be externally set,
    wherein the reference voltage generating unit includes a plurality of first multipliers that sequentially raise the inputted reference voltage to the nth power, starting from the lowest reference voltage.

4. The logarithmic A/D converter of claim 3, wherein n in the nth power is two.

5. The logarithmic A/D converter of claim 2, further comprising:
    a reference voltage sequentially selecting unit that sequentially selects said reference voltage to be inputted to the second multiplier; and
    a sequentially outputting unit that sequentially outputs a value which has been outputted by the comparator.

6. The logarithmic A/D converter of claim 2, further comprising:
    an output voltage sequentially selecting unit that sequentially selects a voltage outputted by the second multiplier.

7. The logarithmic A/D converter of any of claims 1 and 2, making comparisons in parallel.

8. A logarithmic A/D conversion method, comprising:

generating a plurality of reference voltages, wherein values of the reference voltages have a relation of a progression made by raising the reference voltages to an nth power from an inputted reference voltage;

generating a plurality of comparison voltages based on at least one of the plurality of reference voltages; and determining an output digital value based on the plurality of comparison voltages, the output digital data corresponding to a voltage to be converted.

9. The logarithmic A/D conversion method of claim 8, generating each comparison voltage by multiplying at least one of the reference voltages and a predetermined base voltage.

10. The logarithmic A/D conversion method of any of claims 8 and 9, comprising:

setting the inputted reference voltage as a lowest reference voltage; and generating higher reference voltages by sequentially raising reference voltages to the nth power, starting from the lowest reference voltage.

11. The logarithmic A/D conversion method of any of claims 8 and 9, comprising:

generating each reference voltage sequentially; and generating the output digital value sequentially.

12. The logarithmic A/D conversion method of any of claims 8 and 9, comprising:

generating each comparison voltage sequentially; and determining the output digital value by sequentially comparing each comparison voltage with the voltage to be converted.

13. The logarithmic A/D conversion method of any of claims 8 and 9, comprising:

generating the plurality of comparison voltages in parallel in accordance with bit sequences, and making comparisons in parallel.

14. The logarithmic A/D conversion method of claim 8, wherein n in the nth power is two.

15. A physical quantity measuring system, comprising a logarithmic A/D converter that includes:

a reference voltage generating unit that contains at least one first multiplier that raises a predetermined inputted reference voltage to an nth power;

a comparison voltage generating unit that is connected to an output terminal of the reference voltage generating unit; and a comparator connected to an output terminal of the comparison voltage generating unit and to an input terminal for a voltage to be converted;

wherein a voltage inputted to the physical quantity measuring system is connected to a base voltage input terminal of the converter, and a voltage outputted from the quantity measuring system is connected to the input terminal for a voltage to be converted.

* * * * *